(12) United States Patent
Toprac

(10) Patent No.: US 6,268,227 B1
(45) Date of Patent: Jul. 31, 2001

(54) METHOD FOR CONTROLLING PHOTORESIST REMOVAL PROCESSES

(75) Inventor: Anthony J. Toprac, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/401,585

(22) Filed: Sep. 22, 1999

(51) Int. Cl.$^7$ .................................................. H01L 21/66
(52) U.S. Cl. .................................................................. 438/16
(58) Field of Search ................................ 438/16, 14–15, 438/17–18, 800; 430/326, 191, 192–193

(56) References Cited

U.S. PATENT DOCUMENTS 4,661,436 * 4/1987 Lewis et al. ......................... 430/326

FOREIGN PATENT DOCUMENTS

36206341 * 3/1987 (JP) ............................. H01L/21/30

* cited by examiner

Primary Examiner—Charles Bowers
Assistant Examiner—Craig Thompson
(74) Attorney, Agent, or Firm—Williams, Morgan & Amerson, P.C.

(57) ABSTRACT

A method for fabricating wafers is provided. A photoresist layer is formed on a wafer. A first thickness of the photoresist layer is measured, and a portion of the photoresist layer is removed. A second thickness of a remainder portion of the photoresist layer is measured. A photoresist removal rate is determined based on the first and second thicknesses, and a recipe of a developer is modified based on the photoresist removal rate. A wafer processing system includes a stepper, a developer, and an automatic process controller. The stepper is adapted to expose a wafer having a photoresist layer deposited thereon. The developer is adapted to remove at least a portion of the photoresist layer based on a recipe. The process controller is adapted to receive a photoresist removal rate and modify the recipe based on the photoresist removal rate.

10 Claims, 4 Drawing Sheets

METHOD FOR CONTROLLING PHOTORESIST REMOVAL PROCESSES

BACKGROUND OF THE INVENTION

1. Field of the Invention

This invention relates generally to photolithography techniques for patterning semiconductor devices, and, more particularly, to a method for controlling photoresist removal processes.

2. Description of the Related Art

Conventionally, semiconductor devices are patterned using photolithographic processes. A base material, such as a substrate material, a metal, an insulator, etc., is coated with a light sensitive material, referred to as a photoresist material. The photoresist is generally a composition that is sensitive to active rays of light, such as ultraviolet rays, X-rays or electron rays. The photoresist is deposited on the base material to selectively protect non-process portions of the substrate. Light is then selectively directed onto the photoresist film through a photomask to form photoresist patterns on the base material. The photoresist is then developed to remove either the exposed photoresist or the unexposed photoresist.

There are generally two types of photoresist, namely positive type and negative type. The positive photoresist is of such a type that the exposed portion dissolves in the developer, while the unexposed portion does not dissolve therein, and the negative photoresist is of the opposite type. Certain photoresist materials do not complete the transition from being soluble to being insoluble in the developer based solely on the exposure to light. These photoresist materials, referred to as chemically-assisted photoresists, are subjected to a post exposure bake process to complete the chemical reaction to transition from soluble to insoluble (i.e., for a positive resist).

The process of using a chemically-assisted photoresist is described in greater detail in reference to FIGS. 1A through 1D. FIG. 1A shows a wafer 10 including a base material 12 with a photoresist layer 14 deposited thereon. In FIG. 1B, the photoresist layer 14 is exposed to a light source through a photomask (not shown) to define exposed regions 16. Exposure to the light causes hydrogen free radicals to form in the exposed regions 16, which are on the surface of the photoresist layer 14. In FIG. 1C, the wafer 10 is subjected to a post exposure bake to complete the solubility transition chemical reaction and form baked regions 18. During the post exposure bake, the free radicals diffuse downward and react with the photoresist 14 beneath the exposed regions 16. Typically, for a deep UV photoresist layer 14, the post exposure bake time is about 60–90 seconds. As shown in FIG. 1D, a developer may then be applied to remove the remaining photoresist 14 (i.e., for a negative resist—shown in FIG. 1D) or to remove the baked portions 18 (i.e., for a positive resist—not shown).

Accurate control of the developing process, also referred to as the photoresist removal, is important for preventing defects in the wafer. If the photoresist removal time is too short, remnants of the photoresist layer will be present on the wafer, interfering with subsequent processing steps. Typically, a minimum removal time is programmed into the recipe of the developer, however, variations in the photoresist, developer, photoresist layer thickness, etc., may result in different photoresist removal rates for various wafers in the same or different lots. Accordingly, a minimum removal time does not always ensure that all of the photoresist is removed.

The present invention is directed to overcoming, or at least reducing the effects of, one or more of the problems set forth above.

SUMMARY OF THE INVENTION

One aspect of the present invention is seen in a method for fabricating wafers. A photoresist layer is formed on a wafer. A first thickness of the photoresist layer is measured, and a portion of the photoresist layer is removed. A second thickness of a remainder portion of the photoresist layer is measured. A photoresist removal rate is determined based on the first and second thicknesses, and a recipe of a developer is modified based on the photoresist removal rate.

Another aspect of the present invention is seen in a wafer processing system including a stepper, a developer, and an automatic process controller. The stepper is adapted to expose a wafer having a photoresist layer deposited thereon. The developer is adapted to remove at least a portion of the photoresist layer based on a recipe. The process controller is adapted to receive a photoresist removal rate and modify the recipe based on the photoresist removal rate.

BRIEF DESCRIPTION OF THE DRAWINGS

The invention may be understood by reference to the following description taken in conjunction with the accompanying drawings, in which like reference numerals identify like elements, and in which.

Figure 1A:
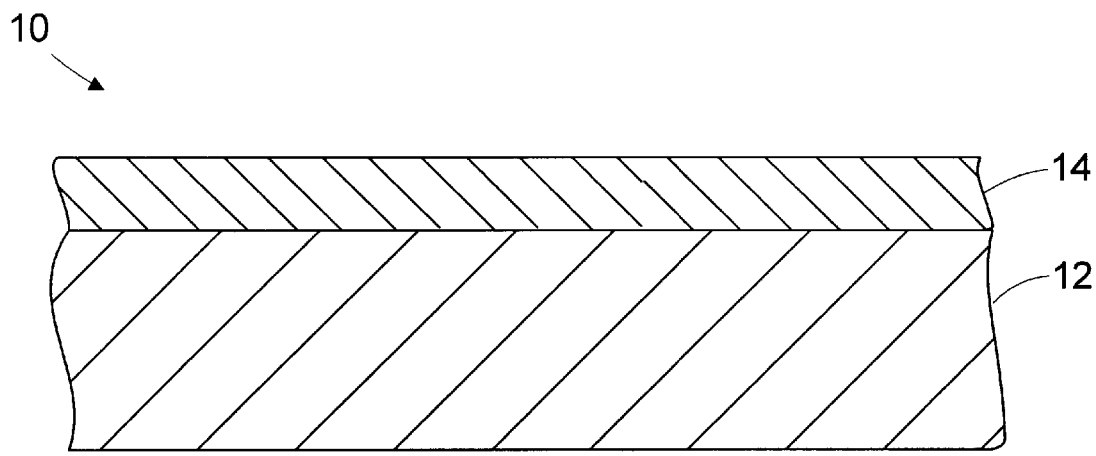
FIGS. 1A is a cross-section view of a prior art substrate with a layer of photoresist formed thereon.
Figure 1B:
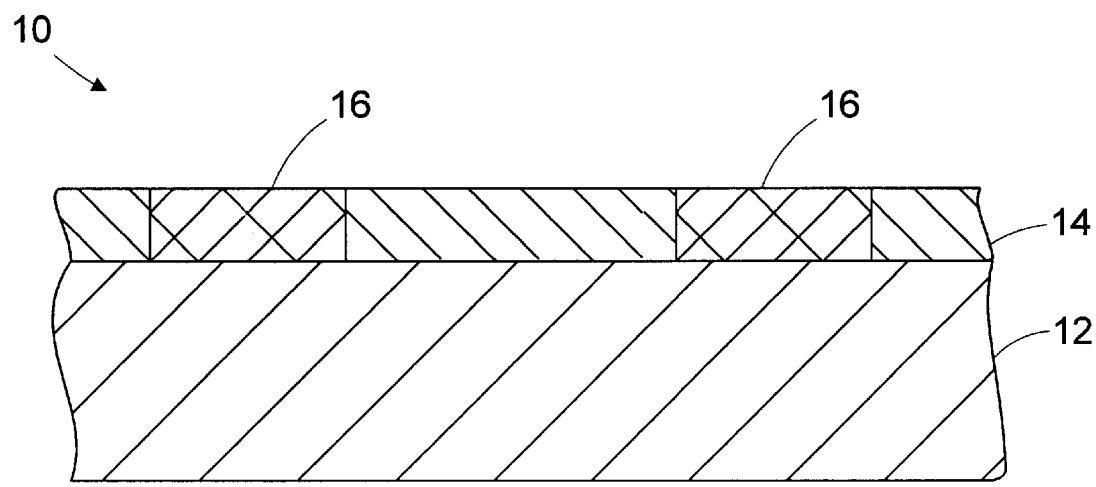
FIG. 1B is a cross-section view of the substrate of FIG. 1A after the photoresist has been exposed to a light source.
Figure 1C:
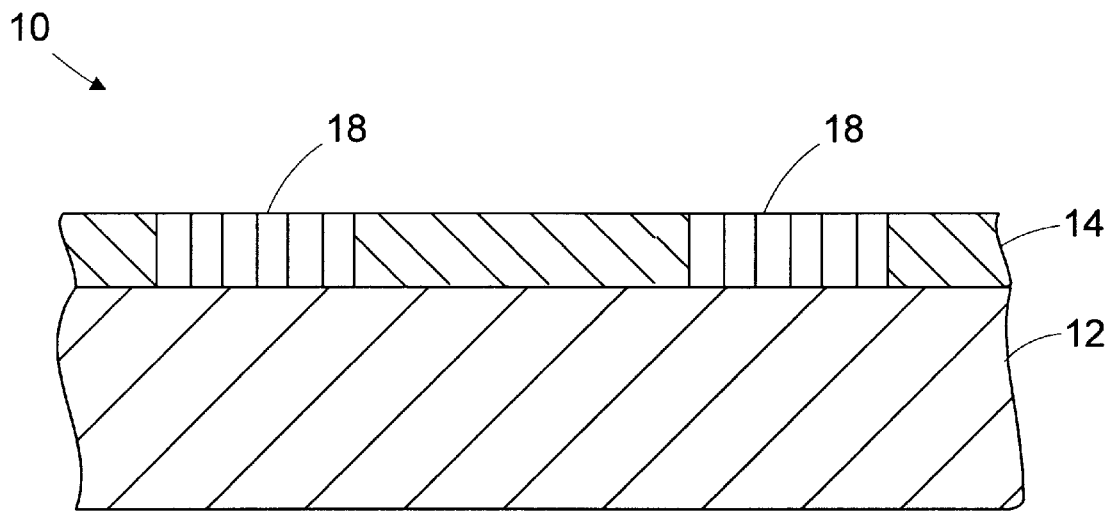
FIG. 1C is a cross-section view of the substrate of FIG. 1B after the substrate has been subjected to a post exposure bake process.
Figure 1D:
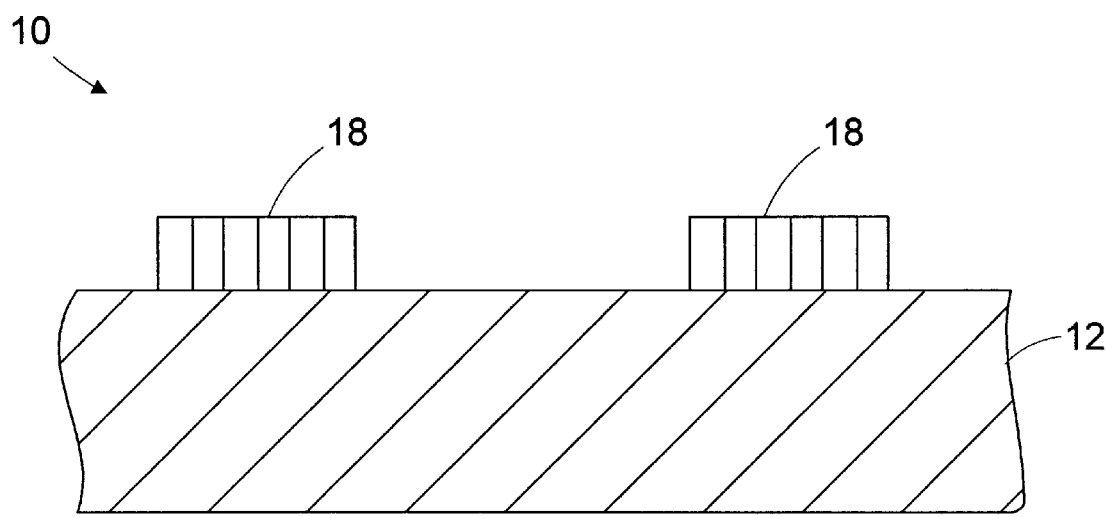
FIG. 1D is a cross-section of the substrate of FIG. 1B after the photoresist has been developed to remove the unexposed portions.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2:
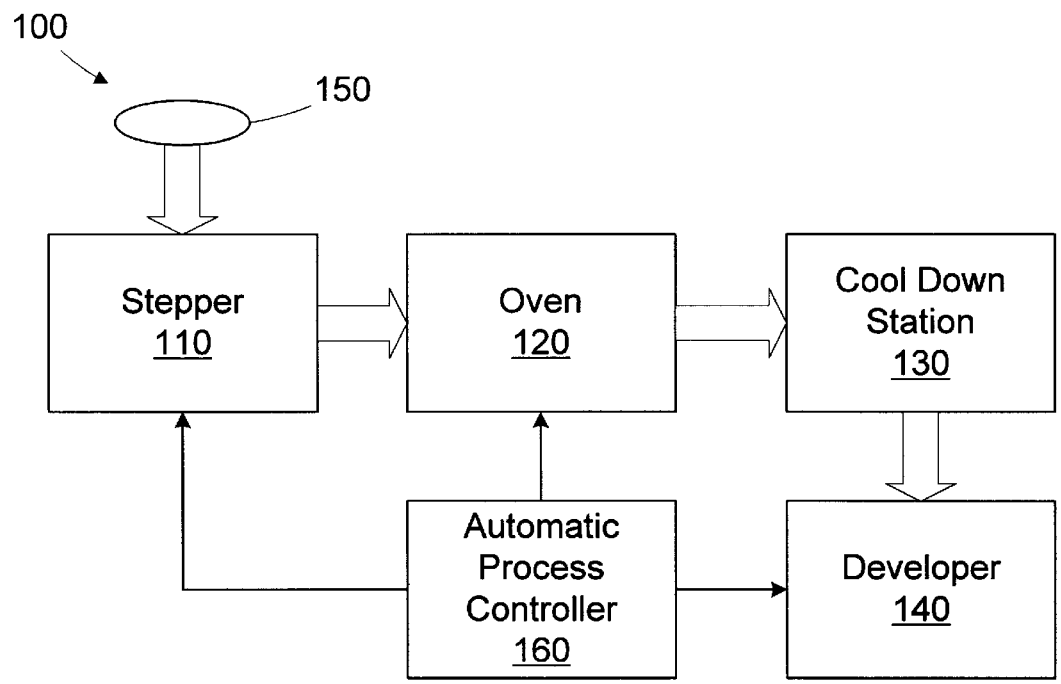
FIG. 2 is a simplified diagram of an illustrative processing line for performing photolithography patterning.

Referring now to the figures, and in particular, to FIG. 2, a simplified diagram of an illustrative processing line 100 for performing photolithography patterning is provided. The processing line 100 includes a stepper 110, an oven 120, a cool down station 130, and a developer 140. The stepper 110 receives a wafer 150 (i.e., or lot of wafers) and exposes the wafer 150 to a light source using a photomask to pattern the wafer 150. The wafer 150 is transferred to the oven 120, where a post exposure bake is conducted. Following the post exposure bake, the wafer 150 is transferred to a cool down station 130, and then to the developer 140, where the unexposed photoresist is removed. The automatic process controller 160 interfaces with at least one of the stepper 1 10, the oven 120, and the developer 140 to modify their respective operating recipes based on manual or automatic (i.e., software) input. In the illustrated embodiment, the automatic process controller 160 receives a photoresist removal rate input, as described in greater detail below, and adjusts the recipe of the developer 140 to account for removal rate variations or trends. As will be recognized by those of ordinary skill in the art in light of this disclosure, the processing line 100 may include discrete or integrated processing tools for performing the processing steps described herein.

Figure 3:
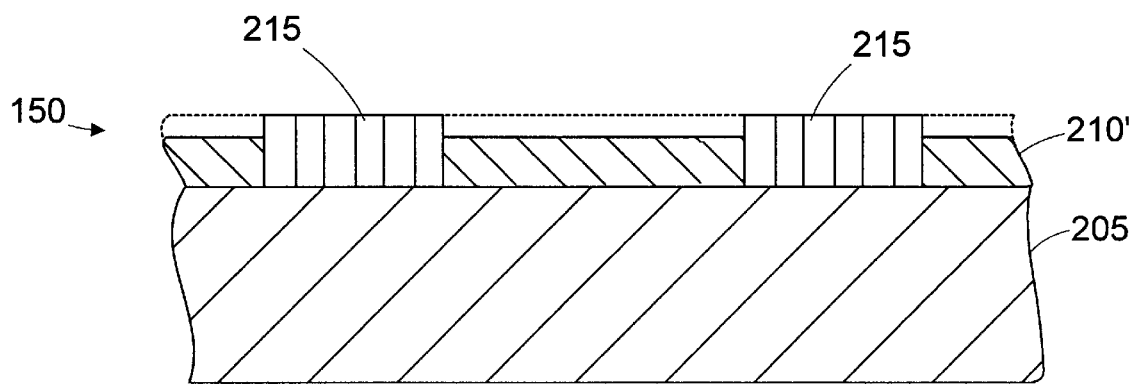
FIG. 3 is a cross-sectional view of a wafer in the processing line of FIG. 2.

Referring to FIG. 3, a cross-sectional view of a wafer 150 having a base material 205 is shown. A photoresist layer 210, having patterned (i.e., exposed and baked) regions 215, is present on the base material 205. The thickness of the photoresist layer 210 is measured. Metrology tools for determining the thickness of the photoresist layer 210 are known in the art. For example, an Opti-Probe tool sold by Therma-Wave, Inc. of Fremont, Calif. may be used. A portion of the photoresist layer 210 is then removed in the developer 140, leaving a remainder photoresist layer 210'. The thickness of the remainder photoresist layer 210' is measured and compared to the previously measured thickness of the photoresist layer 210. The time required to remove the portion of the photoresist layer 210 is also measured and used in conjunction with the thicknesses of the layers 210, 210' to determine a photoresist removal rate.

Using the photoresist removal rate so determined, the recipe of the developer 140 may be adjusted to change the develop time accordingly. It is contemplated that other recipe parameters, such as developer dose, developer dose rate, spin speed of developer (i.e., the wafer is typically coated with developer using a spin deposition technique) may be adjusted based on the photoresist removal rate.

There are numerous advantages for determining the photoresist removal rate. The efficiency of the processing line 100 is determined in part by the time the wafers 150 spend in the developer 140. An accurate determination of the minimum time required to complete the photoresist removal may increase this efficiency by allowing the develop time to be shortened without increasing the defect rate. Accurate knowledge of the photoresist removal rate also allows adjustments for variations caused by factors such as different photoresist lots, variations in the developer concentration, etc.

In the illustrated embodiment, the photoresist removal rate is determined periodically and communicated automatically (i.e., by metrology equipment - not shown) or manually (i.e., by the metrology equipment operator) to the automatic process controller 160. Depending on the characteristics of the processing line 100, the removal rate determination may be conducted on one or more wafers 150 in a lot, one wafer 150 per shift, one wafer 150 per day, one wafer 150 per week, etc. The photoresist removal rate may be determined using a blank wafer (i.e., no underlying topology, or alternatively, using a production wafer. The wafer 150 may or may not have the same photoresist pattern formed thereon.

It is also contemplated that in certain situations, where excessive removal may be detrimental to the device being manufactured, the removal rate may be determined for every wafer 150. For example, after a portion of the photoresist layer 210 is removed and the removal rate is determined, the wafer 150 may be returned to the developer 140 to remove the remainder photoresist layer 210' using an end point determined by the measured thickness of the remainder photoresist layer 210' and the photoresist removal rate.

Figure 4:
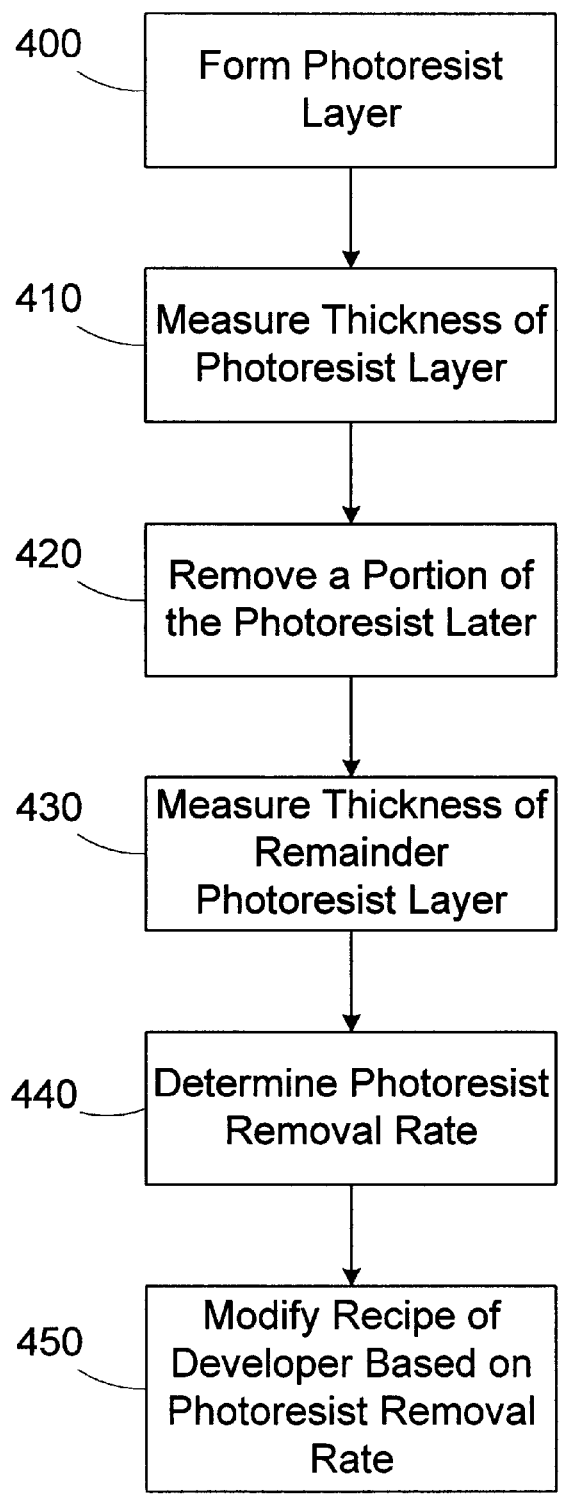
FIG. 4 is a flow diagram of a method for developing a wafer.

Turning now to FIG. 4, a flow diagram of a method for developing a photoresist layer 210 is provided. In block 400, the photoresist layer 210 is formed on the wafer 150. In block 410, the thickness of the photoresist layer 210 is measured. A portion of the photoresist layer 210 is removed in block 420 leaving a remainder photoresist layer 210', and the remainder photoresist layer 210' is measured in block 430. In block 440, a photoresist removal rate is determined based on the thicknesses of the photoresist layer 210, the remainder photoresist layer 210', and the time required to remove the portion of the photoresist layer. In block 450, the recipe of the developer 140 is modified based on the photoresist removal rate. The modified recipe may be used in ensuing processing of the same wafer 150, or in processing of subsequent wafers 150.

The particular embodiments disclosed above arc illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for fabricating wafers, comprising:
   forming a photoresist layer on a wafer;
   measuring a first thickness of the photoresist layer;
   removing a portion of the photoresist layer;
   measuring a second thickness of a remainder portion of the photoresist layer;
   determining a photoresist removal rate based on the first and second thicknesses; and
   modifying a recipe of a developer based on the photoresist removal rate.

2. The method of claim 1, further comprising exposing at least a portion of the photoresist layer to define a photoresist pattern of unexposed and exposed regions.

3. The method of claim 2, wherein removing the portion of the photoresist layer includes removing at least a portion of the unexposed regions.

4. The method of claim 3, further comprising removing the remainder portion based on the photoresist removal rate.

5. The method of claim 1, further comprising processing subsequent wafers in the developer based on the photoresist removal rate.

6. The method of claim 1, wherein modifying the recipe includes modifying a develop time based on the photoresist removal rate.

7. The method of claim 1, wherein modifying the recipe includes modifying at least one of developer dose, developer dose rate, and developer spin speed.

8. A method for fabricating wafers, comprising:

forming a first photoresist layer on a first wafer;

removing at least a portion of the first photoresist layer during a time interval;

determining a photoresist removal rate based on the time interval;

forming a second photoresist layer on a second wafer; and removing at least a portion of the second photoresist layer based on the photoresist removal rate.

9. The method of claim 8, further comprising exposing at least a portion of the second photoresist layer to define a photoresist pattern of unexposed and exposed regions.

10. The method of claim 9, wherein removing the portion of the second photoresist layer includes removing at least a portion of the unexposed regions.

* * * * *